US012051638B2

(12) United States Patent
Chanemougame et al.

(10) Patent No.: US 12,051,638 B2
(45) Date of Patent: Jul. 30, 2024

(54) INTEGRATED HIGH EFFICIENCY TRANSISTOR COOLING

(71) Applicant: Tokyo Electron Limited, Tokyo (JP)

(72) Inventors: Daniel Chanemougame, Niskayuna, NY (US); Lars Liebmann, Mechanicsville, NY (US); Jeffrey Smith, Clifton Park, NY (US); Paul Gutwin, Williston, VT (US)

(73) Assignee: Tokyo Electron Limited, Tokyo (JP)

( * ) Notice: Subject to any disclaimer, the term of this patent is extended or adjusted under 35 U.S.C. 154(b) by 412 days.

(21) Appl. No.: 17/344,231

(22) Filed: Jun. 10, 2021

(65) Prior Publication Data

US 2022/0223496 A1 Jul. 14, 2022

Related U.S. Application Data

(60) Provisional application No. 63/137,443, filed on Jan. 14, 2021.

(51) Int. Cl.
| | |
|---|---|
| *H01L 23/29* | (2006.01) |
| *H01L 21/8234* | (2006.01) |
| *H01L 21/8238* | (2006.01) |
| *H01L 23/473* | (2006.01) |
| *H01L 27/088* | (2006.01) |
| *H01L 27/092* | (2006.01) |

(52) U.S. Cl.
CPC .... *H01L 23/473* (2013.01); *H01L 21/823481* (2013.01); *H01L 21/823878* (2013.01); *H01L 27/0886* (2013.01); *H01L 27/092* (2013.01)

(58) Field of Classification Search
None
See application file for complete search history.

(56) References Cited

U.S. PATENT DOCUMENTS

| | | | |
|---|---|---|---|
| 6,388,317 B1 | 5/2002 | Reese | |
| 2013/0341782 A1* | 12/2013 | Kim | H01L 23/49562 |
| | | | 257/E23.102 |
| 2014/0327128 A1* | 11/2014 | Yoo | H01L 23/29 |
| | | | 257/713 |

FOREIGN PATENT DOCUMENTS

CN 109637989 A 4/2019

OTHER PUBLICATIONS

International Search Report and Written Opinion issued Mar. 10, 2022 in PCT/US2021/059549, 12 pages.
S. J. Pearton, et al., "Perspective: $Ga_2O_3$ for ultra-high power rectifiers and MOSFETS," Journal of Applied Physics, vol. 124, 2018, 20 pages.
Tiwei Wei, "A cool design for hot microchips," Nature, vol. 585, Sep. 10, 2020 pp. 188-189.
Remco van Erp, et al., "Efficient Microchannel Cooling of Multiple Power Devices with Compact Flow Distribution for High Power-Density Converters," IEEE Transactions on Power Electronics, 2019, 12 pages.

* cited by examiner

*Primary Examiner* — Joseph C. Nicely
*Assistant Examiner* — Lamont B Koo (57) ABSTRACT

A microfabrication device is provided. The microfabrication device includes a transistor plane formed on a substrate, the transistor plane including a plurality of field effect transistors; fluidic passages formed within the transistor plane; a dielectric fluid added to the fluidic passages; and a circulating mechanism configured to circulate the dielectric fluid through the transistor plane.

5 Claims, 12 Drawing Sheets

INTEGRATED HIGH EFFICIENCY TRANSISTOR COOLING

INCORPORATION BY REFERENCE

This present disclosure claims the benefit of U.S. Provisional Application No. 63/137,443, filed on Jan. 14, 2021, the entire content of which is incorporated herein by reference in its entirety.

FIELD OF THE INVENTION

This disclosure relates to semiconductor device use and fabrication. This disclosure also relates to a cooling method for semiconductor devices.

BACKGROUND

More data has been created in the last two years than ever before in human history. Big data does not come close to represent the true scale of it. With today's average of 50 Mbps connection speed, it would take 180 million years to download all the data from the internet. This astronomically colossal data need is driving the semiconductor industry more than ever.

With society marching towards an exponential proliferation of semiconductor devices everywhere for all aspects of our life, what used to be mainly a concern for battery life in portable electronics is becoming a civilization sustainability challenge. Indeed, all these devices are consuming a huge amount of energy across the world. Data centers alone already consume 1% of global energy use, about 18 million US homes, with a carbon footprint already equal or larger than the airline industry, and data center construction is on the rise. Even 1% of total electricity use is huge, but it should be noted that the data center energy use has remained flat since 2015 while internet traffic and data center workloads have more than tripled and doubled respectively. This has been possible thanks to major improvements in computing efficiency from data centers, networks and devices, spanning the IT hardware and semiconductor communities as described by Koomey's law and Moore's law. Meanwhile, it is predicted that, past 2021, these efficiency gains will be unable to keep pace with the exponential growth in demand, especially as new technologies emerge. A few examples include high-resolution video streaming, artificial intelligence, machine learning, blockchain, 5G, and virtual reality computing. Electricity generation and management is becoming a significant concern.

One challenging aspect of electricity generation is that electricity usage should be highly efficient. But operating myriad electronic devices generates significant ineffiencies in the form of thermal waste. Consider data centers as an example. Out of the total energy use of a data center, only 60% of that energy is used for actual computations on average. The remaining 40% is dedicated to cool the electronics to maintain optimum performance and reliability. Indeed, during operation of an electronic device, such as a CPU, part of the energy supplied is converted to heat. Because the heat cannot be extracted instantly, the temperature in the chip rises significantly during sustained operation. Performance of devices such as CMOS transistors linearly degrade with a rise in temperature. Transistors are the main source of the heat, which is known as the transistor self-heating effect. Additionally, sustained and repeated operation at high temperature will lead to premature reliability failures of various parts of the transistors and chip's interconnects.

Modern chips have safety mechanisms that will strongly reduce performance to limit the self-heating and avoid long-term damages. To maintain high performance for non-stop operation of any modern computer, robust and adequate cooling solutions are used. The heat generated in data centers is extreme due to the exceptional density of computers packed together inside the limited volume of a building. Cooling solutions commonly found on personal PCs such as heatsinks and fans are quickly overwhelmed and must be supplemented by extreme measures such as air-cooling the whole building to maintain chip temperature under a limit.

The semiconductor industry has been successful in relentlessly increasing the transistor density generation after generation. That in turn enabled great technological and societal progress, but the state of technology is now at a point where the self-heating effect has become a global primary source of performance cost, environmental cost and financial cost. Most of the solutions currently remain largely inefficient and wasteful as the heatsinks or heat exchangers are either at the package level or at the circuit board level, relatively far from the heat sources. As research is investigating solutions to achieve dense 3D integration for ever-higher transistor volume density, like CFET and Gate-on-Gate stacking, highly efficient and integrated cooling becomes an equally important part of the technology to manage high power densities.

SUMMARY

A first aspect is a method of microfabrication. The method may include forming an array of semiconductor devices on a substrate, semiconductor devices from the array of semiconductor devices having one or more solid-state dielectric materials surrounding the semiconductor devices; removing at least a portion of the solid-state dielectric materials surrounding the semiconductor devices resulting in cavities within the array of semiconductor devices; filling the cavities with a dielectric fluid such that the dielectric fluid is in proximate thermal contact with the semiconductor devices; and forming a circulating mechanism to circulate the dielectric fluid from the cavities to a heat dissipation region and back through the cavities.

A second aspect is a microfabrication device. The microfabrication device may include a transistor plane formed on a substrate, the transistor plane including a plurality of field effect transistors; fluidic passages formed within the transistor plane; a dielectric fluid added to the fluidic passages; and a circulating mechanism configured to circulate the dielectric fluid through the transistor plane.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Heat removal in highly dense circuits is already a significant problem today, with vast performance and environmental impact. Heat management will become even more critical in the future as data demand exponentially explodes, especially in the prospect of denser 3D integration. Heat removal is therefore becoming an essential pillar of future technology scaling and must be considered from the beginning as part of the integral solution. All current cooling solutions remain largely energy-hungry and inefficient simply because they are far from the billions of nanoscale heat sources induced by the operating transistors. Ironically, at the nanoscale dimensions of modern chips, the distances over which the heat has to diffuse to reach an actual heat exchanger or heatsink are relatively great, leading to significant self-heating.

Techniques herein provide direct heat exchanges by dielectric liquid immersion as close as possible to the nanoscale heat sources, the transistors. Nano-fluidic channels herein are built in direct nanoscale proximity of the CMOS transistors, allowing highly efficient heat removal from the hot devices to the dielectric liquid. The (possibly room-temperature) liquid is injected into the chip by inlets, once the heat is transferred from the devices to the liquid, the hot liquid is then exhausted through outlets. This first cooling circuit is a closed circuit at the transistor level, inside the chip, and then cooled by a secondary heat exchanger located at the chip surface and a secondary cooling circuit located outside the chip, at the package or board level. Circulating the first and second cooling circuits can be facilitated by MEMs micro-pumps, co-located with or integral part of the secondary heat exchanger, or located at the package or board level, respectively. These techniques herein provide nano-fluidic channels of the first cooling circuit at the transistor level inside the chip.

Figure 1:
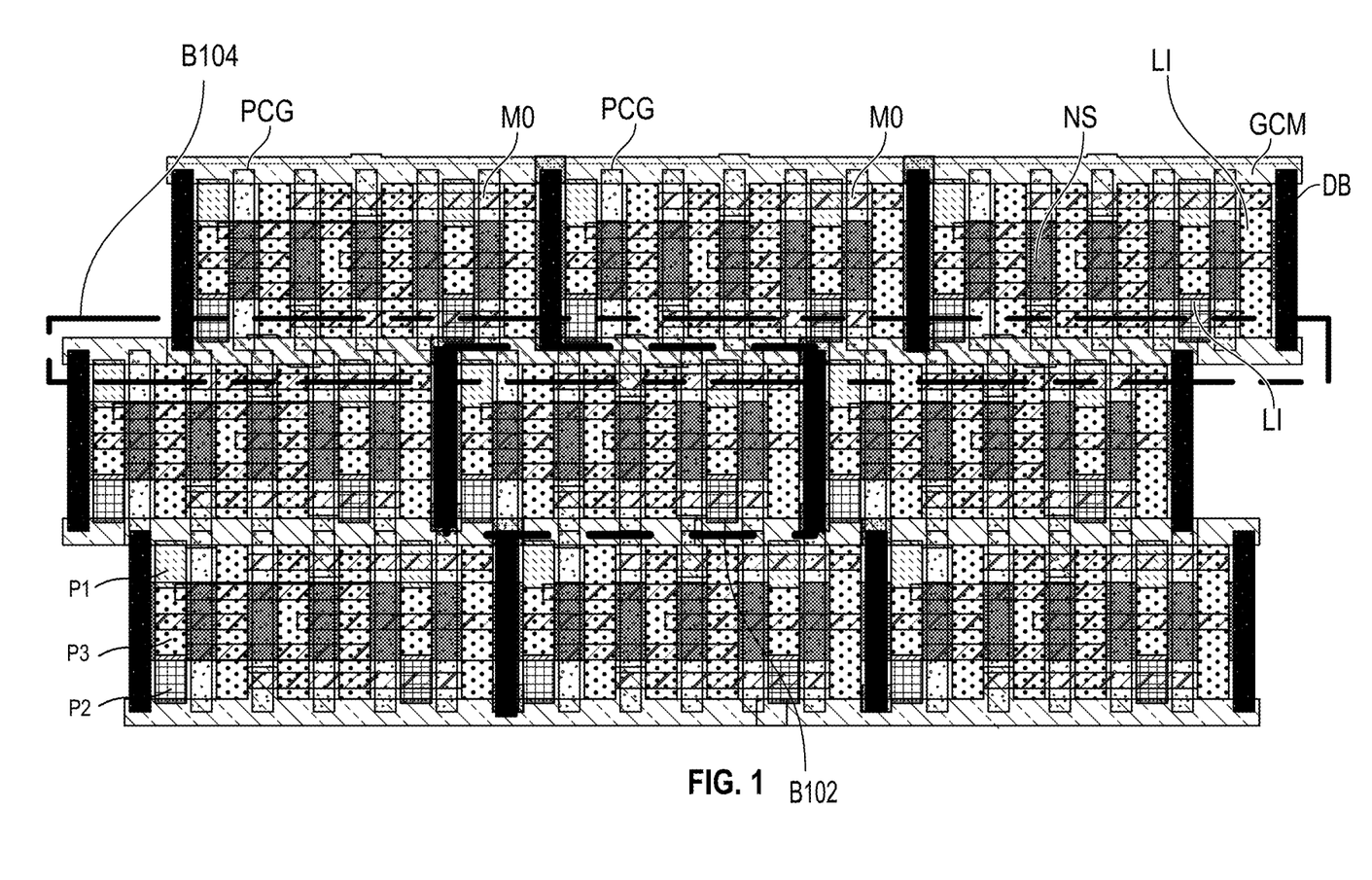
FIG. 1 shows a layout of an array of standard cells, in accordance with some embodiments.

Example embodiments are now described with reference to accompanying drawings. FIG. 1 illustrates a layout of an array of standard cells in accordance with exemplary embodiments of the disclosure.

Such arrays in FIG. 1 can be found in any modern chip designs for any technology, such as planar, finFET (FF), or CFET (complementary field effect transistor). When logic cells are assembled together to build a design (place and route), they naturally form arrays of multiple rows of cells. In particular, each row is separated from the other by the gate cut mask GCM. As shown in FIG. 1, this separation forms a continuous feature that is uninterrupted across large areas of logic blocks in the chip design. The dashed rectangle B102 in the middle of FIG. 1 marks one standard cell. Techniques herein exploit these uninterrupted features and convert them into nano-fluidic channels directly at the transistor-level to enable maximum efficiency heat removal from the active transistors.

In addition, other masks such as diffusion breaks DB, local interconnects LI including first local interconnect pattern P1, second local interconnect pattern P2, overlap of the first and the second local interconnect pattern P3 (bold dots patterns), active NS, gate PCG, metal layer M0 are shown in FIG. 1. P1, P2, and P3 are three different levels of patterns in a direction into the page, e.g., z-direction. A continuous channel across large logic blocks B104 is also shown in FIG. 1.

Figure 2A:
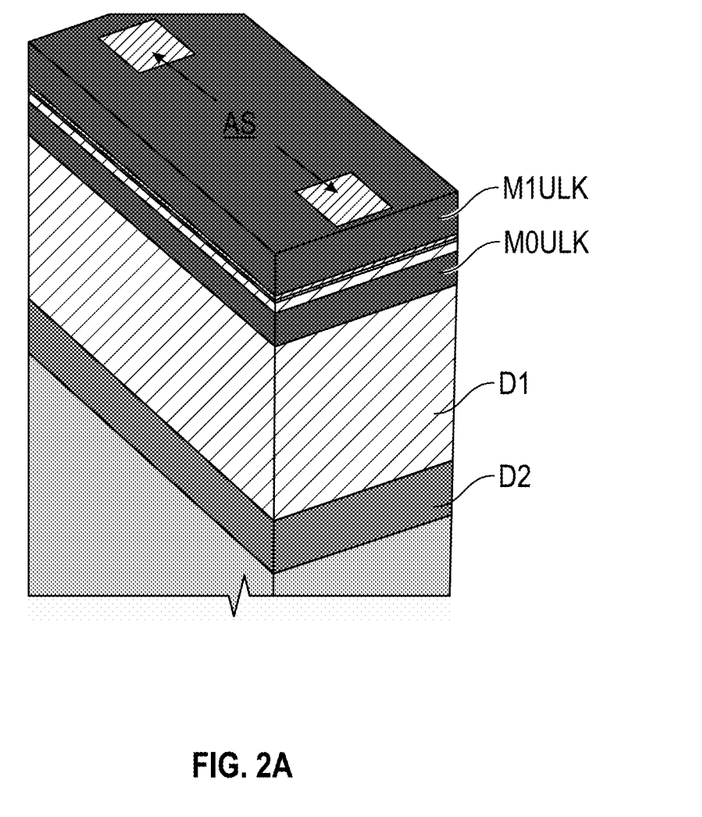
FIG. 2A shows a process of a formation of access shafts, in accordance with embodiments of the disclosure.
Figure 2B:
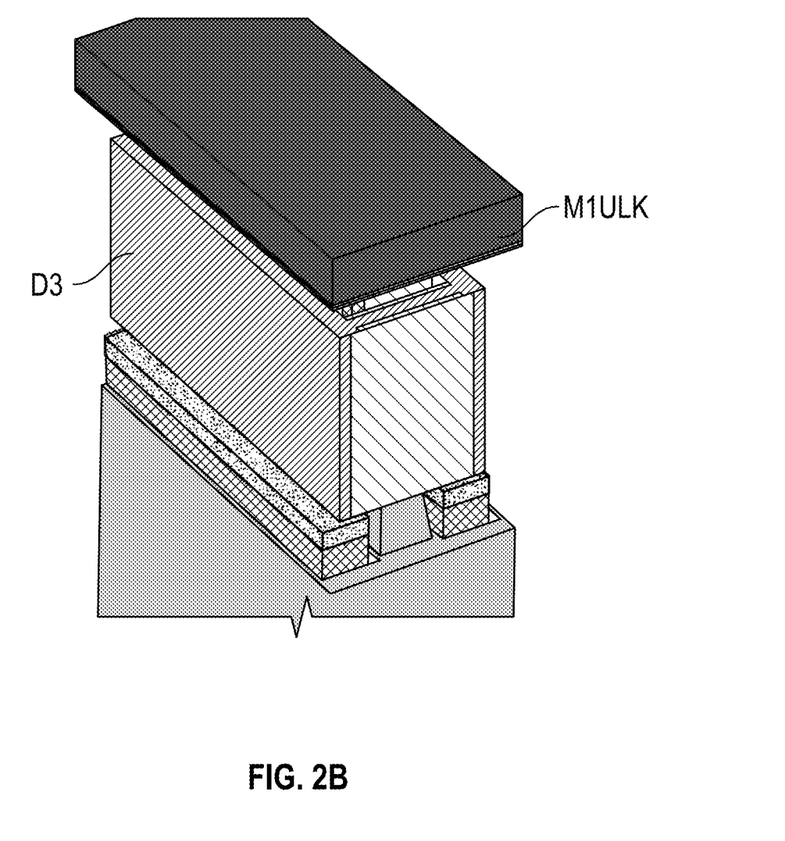
FIG. 2B shows a process of a removal of oxide, in accordance with embodiments of the disclosure.
Figure 2C:
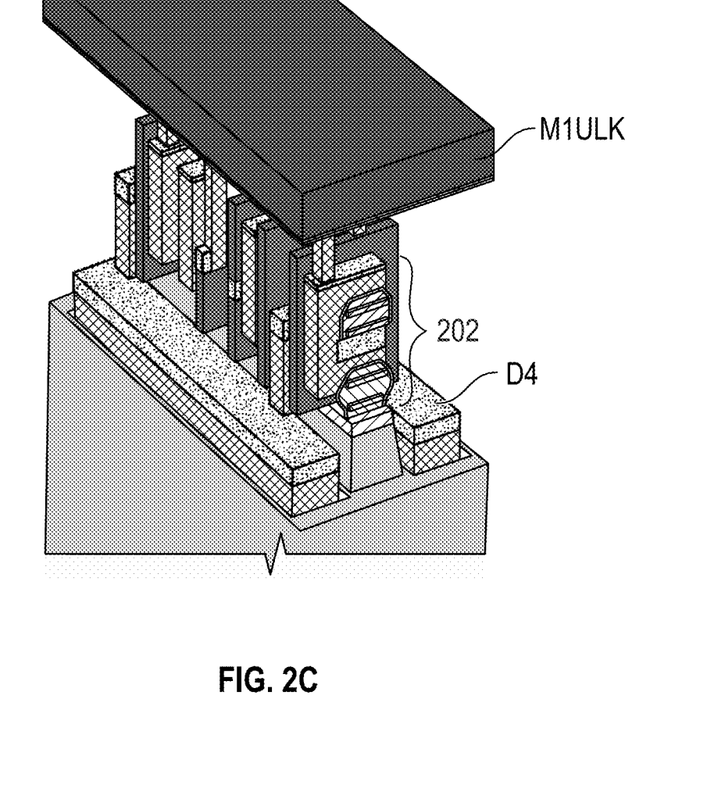
FIG. 2C shows a process of a removal of nitride and spacer materials through the access shafts, in accordance with embodiments of the disclosure.
Figure 2D:
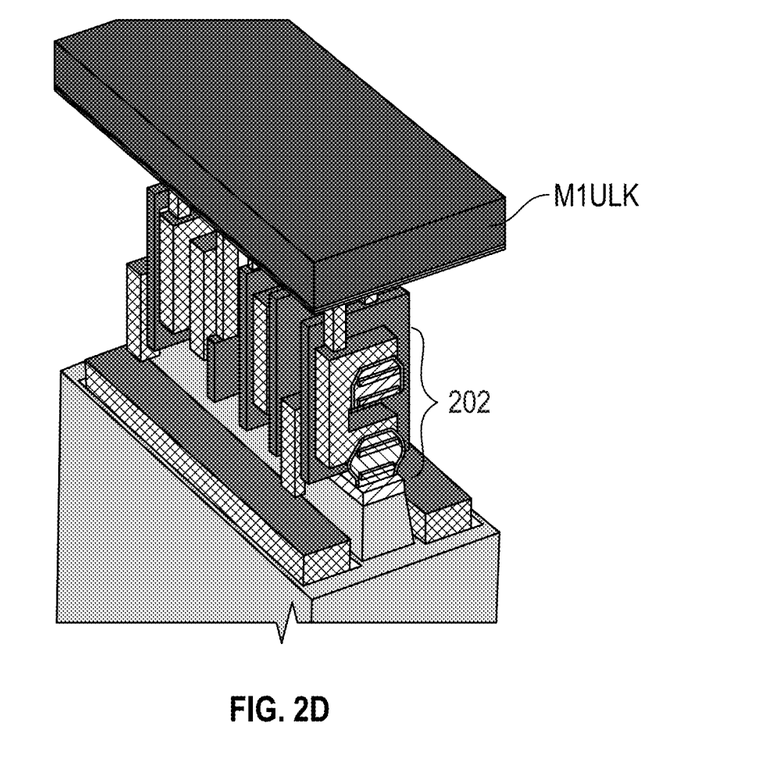
FIGS. 2D and 2E show a process of a removal of dielectric materials, in accordance with embodiments of the disclosure.

Referring now to FIG. 2A, after the integration flow is completed through M1 in step 1, access shafts AS are formed inside M1 ultra low-k M1ULK layer to open access to M0 ultra low-key M0ULK layer. A patterning transfer layer such as SOC (spin-on-carbon) or SOG (spin-on-glass) can also be deposited on M1ULK to pattern the access shafts AS (not shown). Once M0ULK layer is exposed by an etch process, a liner deposition (SiCN or SiN, or the like) followed by a dry etch can be executed to protect the exposed sidewall of M1ULK layer. M0ULK layer can then be selectively removed by an etch process (a wet etch, a dry etch, or a combination thereof), further exposing other oxide materials below such as dielectric material D1 and shallow trench insulator oxide material D2 used in the FEOL (front-end-of-line). The transfer layer (SOC or SOG) and resist can then be stripped leading to step 2 of FIG. 2B.

Figure 2E:
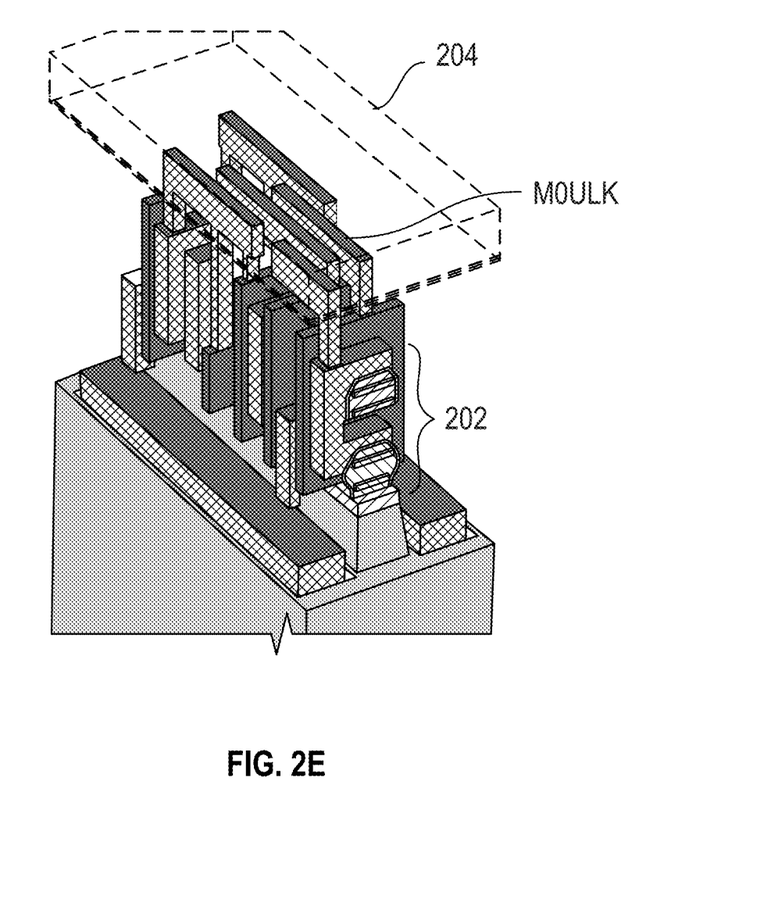

Next, the nitride material D3 used to create the row separation during the gate cut process can be selectively removed by an etch process (e.g., a wet and dry etch combination) through the M1 access shafts AS. Other materials like the gate spacer (SiOC or low-K nitride, SiOCN, or the like) surrounded by nitride material D3 can also be selectively removed in the step 3 of FIG. 2C. In the step 4 of FIG. 2D, the AlO dielectric layer D4 capping some of the interconnects can also be removed. The active elements including the transistors and the interconnects are now fully exposed and can be seen in the step 4 of FIG. 2D and the step 5 of FIG. 2E. It should be noted that the example transistor of FIGS. 2A-2E is a CFET (complementary field effect transistor) structure 202 with buried power rail as an example but this technique applies to any technology including planar, SOI (silicon-on-insulator), FF or CFET. FIG. 2E shows a translucent M1ULK 204 layer in order to show the M0ULK lines.

Once the nano-fluidic channels are created, the patterning layer (SOC or SOG) and the photoresist can be stripped. Then the process can resume completing the rest of the BEOL (back-end-of-line) metal layers on top of M1ULK. When this happens, the non-conformality of the material depositions used in the BEOL can be used to close off the M1 access shafts AS without filling the space below, effectively sealing the nano-fluidic channels. Accordingly, transistor-level nano-fluidic channels are created in direct proximity to the active heat sources, e.g., the transistors.

Figure 3A:
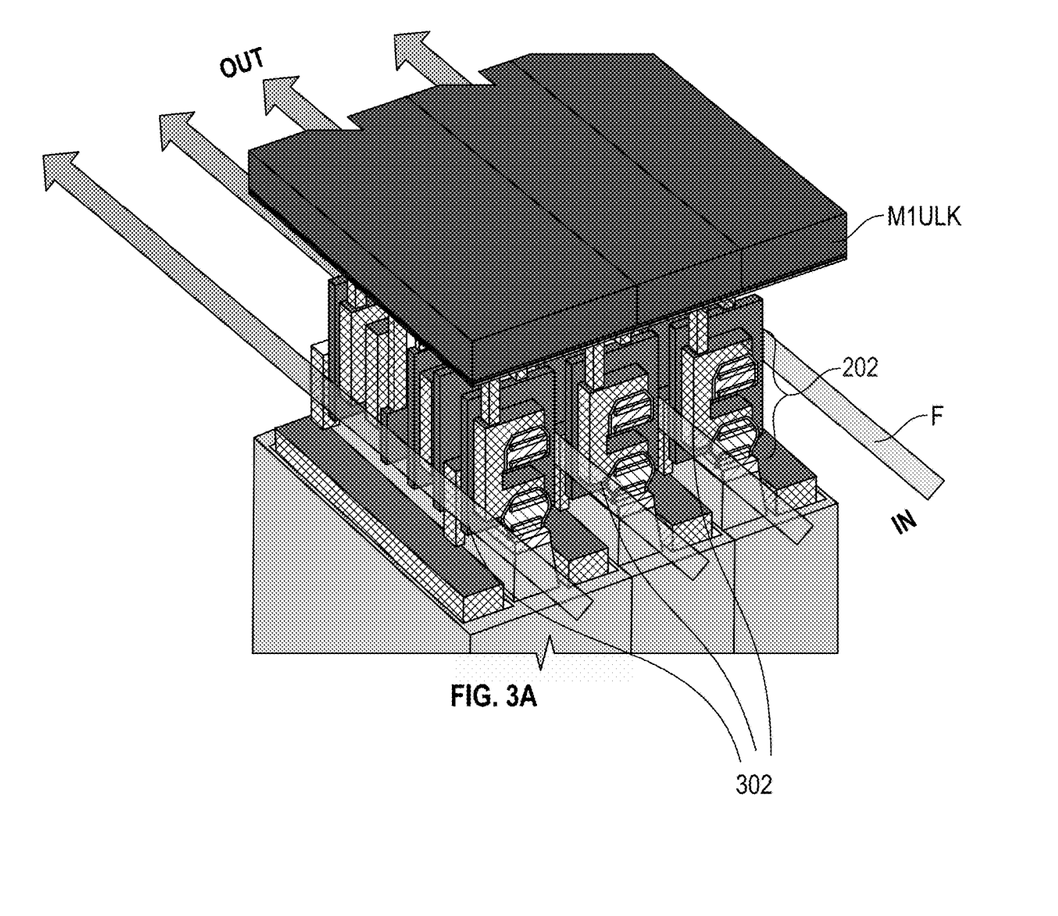
FIGS. 3A and 3B show perspective views of substrate segments, in accordance with exemplary embodiments of the disclosure.
Figure 3B:
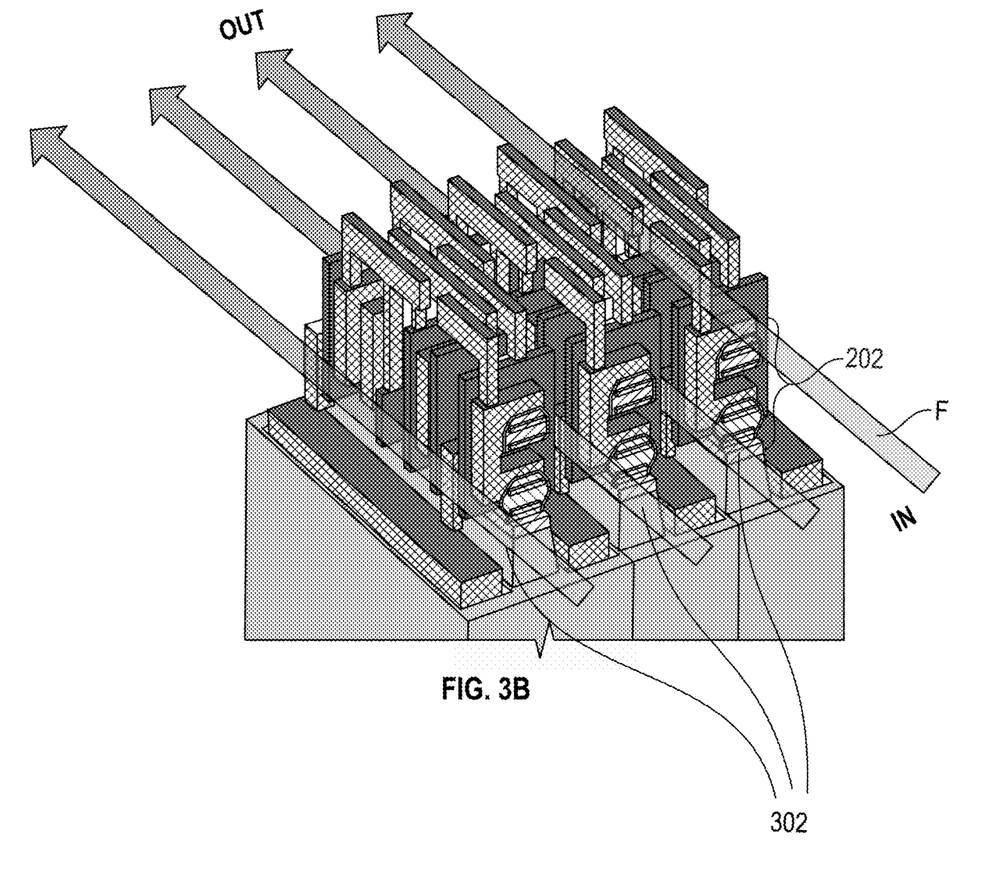

The operation of the nano-fluidic channels 302 to remove heat from active devices such as CFET 202 using dielectric liquid F is shown in FIGS. 3A and 3B. FIGS. 3A and 3B show perspective views of substrate segments with exemplary embodiments of the disclosure. M1 stack materials forming a cap of the nano-fluidic channels 302 are removed from the picture in FIG. 3B only for visualization purpose. This illustrates that hot device areas are directly exposed to the dielectric liquid and that the solid to liquid contact surface area is extremely large. This configuration in FIGS. 3A and 3B enable extremely efficient direct heat exchange and cooling of the active devices. As shown in FIG. 3A and FIG. 3B, cool fluid (light gray) flows into the nano-fluidic channels 302 from inlets IN to perform heat transfer in the nano-fluidic channels 302, and then the hot fluid (dark gray) after the heat transfer flows out to the outlets OUT.

Figure 4A:
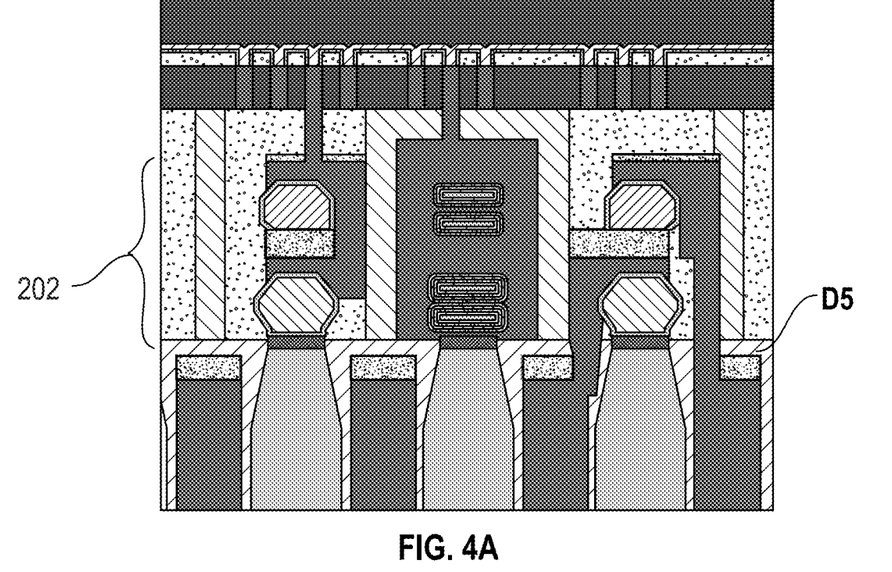
FIGS. 4A-4C show cross-sectional views of the created channels between rows of standard cells, in accordance with exemplary embodiments of the disclosure.
Figure 4B:
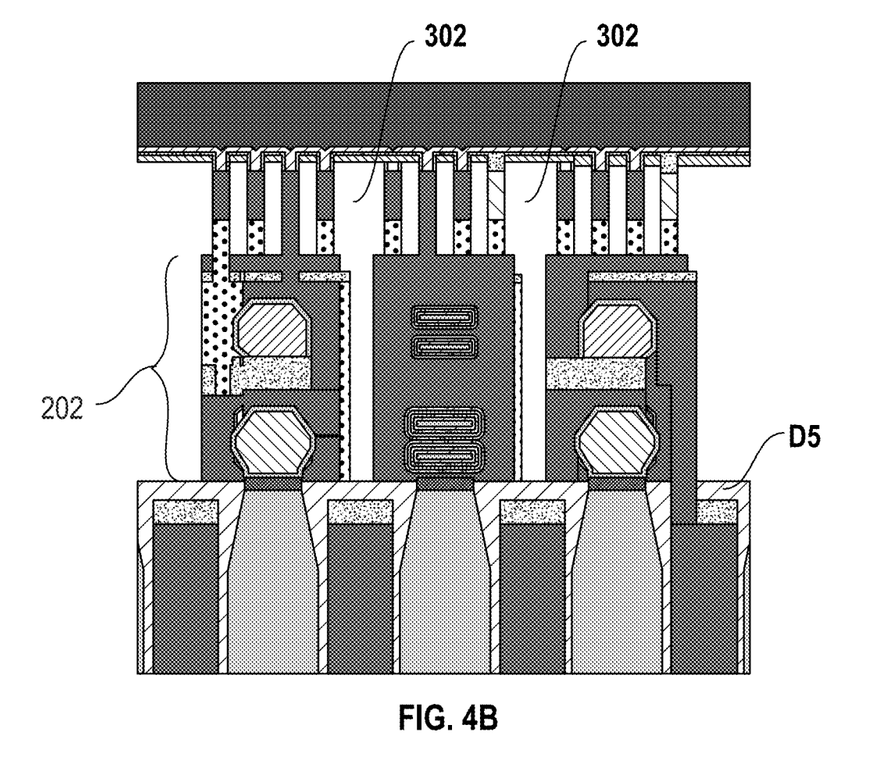
Figure 4C:
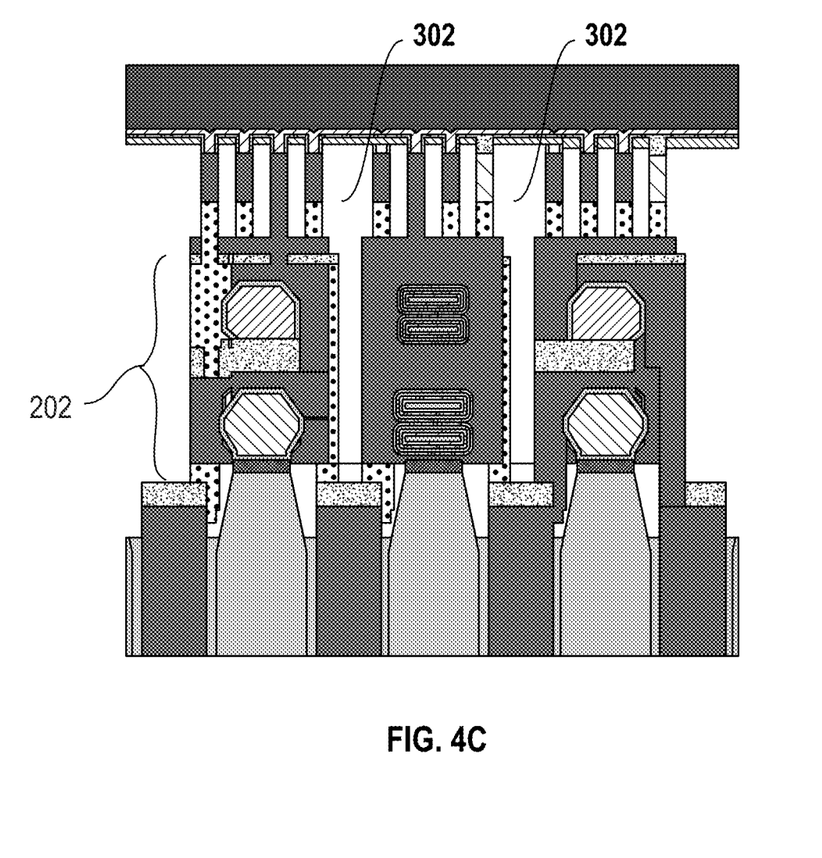

FIGS. 4A-4C provide cross-sectional views of the created channels between rows of standard cells in accordance with exemplary embodiments of the disclosure. As can be seen in FIG. 1, channel width can vary along a row depending on the layout and presence of the interconnect layer (e.g., two stacked interconnect layers in the case of CFET). As an example, the width of the channel can vary from 15 to 200 nm. FIG. 4A shows an initial structure of standard cells. CFET 202 structure is shown in FIG. 4A. A dielectric material D5 typical for shallow trench isolation (STI) is also shown in FIG. 4A. FIG. 4B shows the standard cells after a formation of nano-fluidic channel 302. FIG. 4C shows the standard cells after removing the dielectric material D5.

Figure 5A:
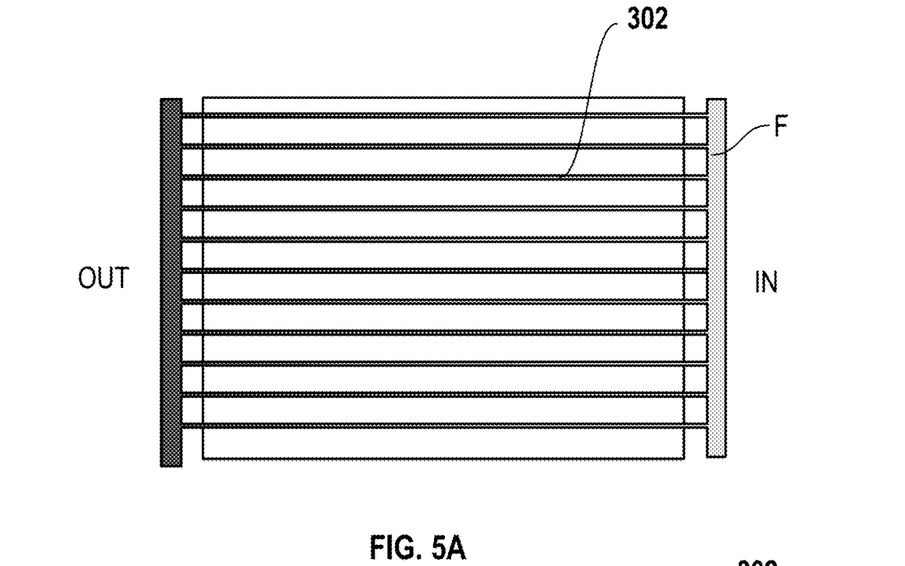
FIGS. 5A-5B show high-level details at the system level, in accordance with exemplary embodiments of the disclosure.
Figure 5B:
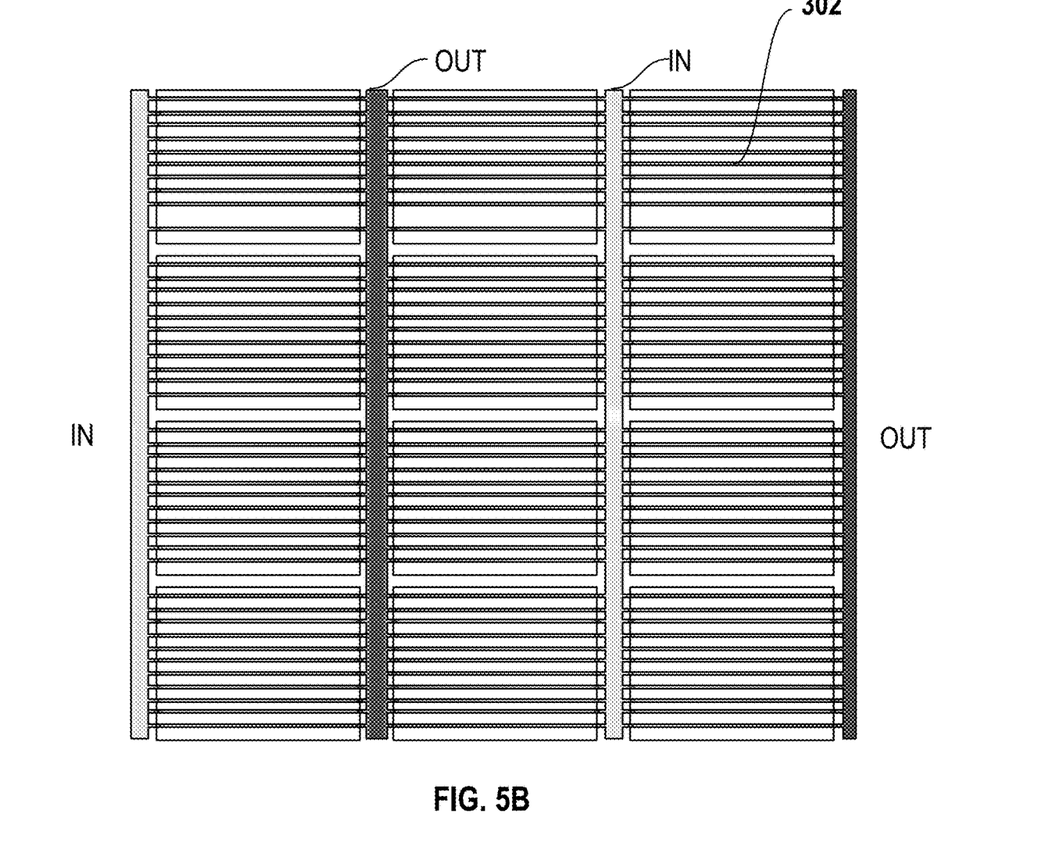

FIGS. 5A and 5B illustrate high-level details at the system level, including packaging, on how transistor-plane cooling systems herein are used in connection with other constructs and inventions in accordance with exemplary embodiments of the disclosure. In FIG. 5A, a top view of a logic block illustrates how the nano-fluidic channels 302 inside a logic block can all be connected together to wider inlet IN and outlet OUT at the block boundaries. Dark grey of the fluid F on the left side of FIG. 5A indicates hot temperatures while light grey of the fluid F on the right side of FIG. 5A indicates cool temperatures. FIG. 5B shows a chip-scale layout illustrating how multiple block inlets IN and outlets OUT can connect together, forming a cooling distributed network (CDN).

Figure 6:
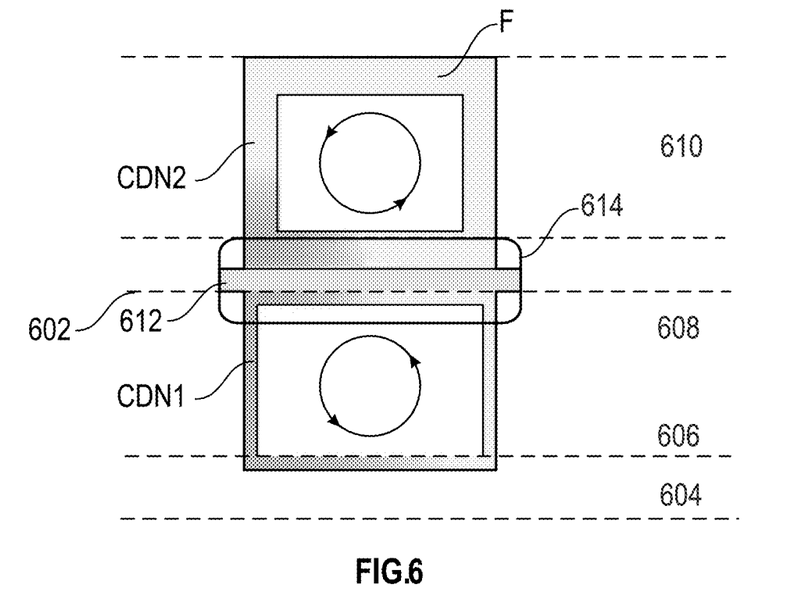
FIG. 6 shows high-level details on a front side of the chip at the system level, including packaging, in accordance with exemplary embodiments of the disclosure.

FIG. 6 provides high-level details on a front side of the chip at the system level, including packaging, on how embodiments herein can be used in connection with other constructs and inventions.

FIG. 6 also shows a cross-sectional view at the package level in accordance with exemplary embodiments of the disclosure. The cross-section view of FIG. 6 shows how block inlets and outlets of the primary CDN CDN1 or cooling circuit extend all the way from the transistor level 604 at the bottom to the top BEOL layer on the top of the chip level 608, forming a closed circuit. A secondary CDN CDN2 located in the package level 610 can be used to remove the heat from the primary CDN CDN1, enabled by a heat exchanger 614 placed at the chip to package interface 602 with a typical large heatsink 612.

In the top layers of a given chip BEOL, MEMs, nano and/or micro-pumps incorporated therein function to ensure dielectric liquid circulation in both the primary and secondary CDNs for effective heat transfer. Alternatively, pumps can be an integral part of the heat exchanger module. As mentioned earlier in FIG. 5A, 5B, cool fluid (light gray) flows into the nano-fluidic channels 302 from inlets IN and the hot fluid (dark gray) flows out from the outlets OUT in CDN1 and CDN2.

Techniques herein, however, provide a path for direct heat exchange that is proximal to the transistors with an extremely high exchange surface area for highly efficient heat removal. While this solution uses some of the chip total area, it opens the way to quasi-instant heat removal, solving many chip and system-level thermal problems, usually leading to reduced performance and user inconveniences. As described earlier, this quasi-instant heat removal promises even larger gains in the large-scale systems such as data centers. With such gains on cooling efficiency, the power density of a corresponding chip can be increased significantly.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A microfabrication device comprising:
    a transistor plane formed on a substrate, the transistor plane including a plurality of field effect transistors;
    fluidic passages formed within the transistor plane, wherein the formation of the fluidic passages includes removing at least a portion of solid-state dielectric materials surrounding the plurality of field effect transistors;
    a dielectric fluid added to the fluidic passages; and
    a circulating mechanism configured to circulate the dielectric fluid through the transistor plane.

2. The microfabrication device of claim 1, wherein the solid-state dielectric materials are silicon oxide or silicon nitride.

3. The microfabrication device of claim 2, wherein the removing the at least a portion of solid-state dielectric materials includes etching the portion of solid-state dielectric materials through one or more access shafts.

4. The microfabrication device of claim 3, wherein the formation of the fluidic passages further includes closing the one or more access shafts after removing the at least a portion of solid-state dielectric materials.

5. A microfabrication device comprising:
    a package structure on an array of semiconductor devices on a substrate;
    first set of fluidic passages formed between the package and the array of semiconductor devices on the substrate;
    second set of fluidic passages formed between cavities within the array of semiconductor devices, wherein the second set of fluidic passages have been formed from removal of at least a portion of solid-state dielectric materials surrounding the array of semiconductor devices;
    dielectric fluid added to the first set of fluidic passages and the second set of fluidic passages; and
    a circulating mechanism configured to circulate the dielectric fluid through the first set of fluidic passages and the second set of fluidic passages to transfer heat.

* * * * *